United States Patent
Jin

[11] Patent Number: 6,064,758
[45] Date of Patent: May 16, 2000

[54] MOUNTING COORDINATE INPUT METHOD AND APPARATUS FOR SURFACE MOUNT DEVICE

[75] Inventor: Sang-Hun Jin, Taegu, Rep. of Korea

[73] Assignee: Daewoo Electronics Co., Ltd., Seoul, Rep. of Korea

[21] Appl. No.: 08/980,010

[22] Filed: Nov. 26, 1997

[30] Foreign Application Priority Data

Nov. 27, 1996 [KR] Rep. of Korea ............ 96-58060

[51] Int. Cl.$^7$ ............ G06K 9/00; B23P 19/00; G06F 15/00
[52] U.S. Cl. ............ 382/151; 29/739; 364/491
[58] Field of Search ............ 382/144, 145, 382/147, 151; 29/703, 709, 739; 364/491; 356/138, 399

[56] References Cited

U.S. PATENT DOCUMENTS

| | | | |
|---|---|---|---|
| 4,646,073 | 2/1987 | Fukunaga et al. | 345/178 |
| 4,805,110 | 2/1989 | Takahashi et al. | 29/703 |
| 5,384,956 | 1/1995 | Sakurai et al. | 29/834 |

FOREIGN PATENT DOCUMENTS

| | | | | |
|---|---|---|---|---|
| 8-181494 | 7/1996 | Japan | H05K | 13/04 |
| 8-228098 | 9/1996 | Japan | H05K | 13/04 |
| 8-236997 | 9/1996 | Japan | H05K | 13/04 |
| 8-288695 | 11/1996 | Japan | H05K | 13/04 |
| WO 94/13124 | 6/1994 | WIPO | H05K | 13/04 |

*Primary Examiner*—Leo H. Boudreau
*Assistant Examiner*—Shawn B. Cage
*Attorney, Agent, or Firm*—Jacobson, Price, Holman & Stern PLLC

[57] ABSTRACT

A mounting coordinate input method and apparatus images a printed circuit board on which a surface mount device is mounted and edits a coordinate and component information necessary to mount the surface mount device on the PCB to produce a mounting information to be inputted to surface mount device equipment. In the method, an image of a printed circuit board is taken. Component information of the surface mount device to be mounted on the printed circuit board at an arbitrary angle is inputted to display a surface mount device mark printed on the printed circuit board corresponding to the component information. Coordinates of first and second reference corners of the surface mount device mark is set and center coordinates of the surface mount device mark is calculated. A reference rectangle of the surface mount device mark is displayed. An arbitrary angle set mode with the surface mount device is selected to display a fan including a predetermined angle formed by a first side defining a straight line between the first reference corner of the surface mount device mark and a cursor on a screen and a second side defining a straight line between the first reference corner and an X-axis on the screen. The predetermined angle of the fan which allows the first side of the fan to coincide with a side of the surface mount device mark is control to set the controlled angle of the fan as the arbitrary angle of the surface mount device.

20 Claims, 7 Drawing Sheets

COMPONENT INFORMATION EDIT WINDOW

COMPONENT NUMBER R601
COMPONENT NAME
COMPONENT CODE HRFT822JCA
CX 100.59 mmR
CY 16.50 mmR
COMPONENT ORIENTATION 90.00 .

ARBITRARY ANGLE
REGISTRATION
DELETE
END

| COMPONENT NUMBER | COMPONENT NAME | COMPONENT CODE | Cx | Cy | COMPONENT ORIENTATION |
|---|---|---|---|---|---|

FIG. 7

MOUNTING COORDINATE INPUT METHOD AND APPARATUS FOR SURFACE MOUNT DEVICE

BACKGROUND OF THE INVENTION

1. Field of the Invention

The present invention relates to a mounting coordinate input method and apparatus, more particularly, to a method and an apparatus for imaging a printed circuit board (PCB) on which a surface mount device is mounted and editing a coordinate and component information necessary to mount the surface mount device on the PCB so as to produce a mounting information to be inputted to surface mount device equipment.

2. Description of the Prior Art

With the process in inserting technologies for PCBs, chip components are inserted at higher densities and the components themselves are becoming smaller. An electronic component a lead of which is inserted in a hole of a PCB has a limitation to the extent of miniaturization and being lightweight. An integrated circuit or a surface mount device which is attached on a surface of the PCB is widely used. Therefore, since it is unsuitable for a person to manipulate a small component, equipment which mechanically mounts the small component on the PCB has been developed. Accordingly automation is indispensable to do that. For the automation, an electronic component and a PCB must be recognized. After the recognition, firstly a position on which the component should be mounted is detected and is then mounted on the position.

In order to exactly mount the component on a desired position of the PCB, a size, a shape, and a standard of a component should be detected. The mounting position of the PCB is detected so that the mounting position information is provided into mounting equipment, to thereby perform the automation. In a course of editing component information, corners of the component are input to the mounting equipment and a center thereof is calculated on the basis of the corners. When a worker inputs a direction of the component, a mounting position of the component is determined. Generally, a mounting direction has the directions of 0°, 90°, 180°, and 270°, but a special component may have an arbitrary angle, for example, the directions of 12°, 123°, and 207°. When mounting a component on the PCB by an arbitrary angle a worker should input the angle to a coordinate input device. However, in an automatic insertion machine, the worker should input the angle thereto but cannot measure the PCB displayed on a screen to input the angle by a visual manner. A method of inputting the angle with respect to components to be mounted by the arbitrary angle needs to be developed.

U.S. Pat. No. 4,646,073 issued to Yasushi Fukunage et al. discloses an input-output coordinate transforming method and apparatus which allows the input coordinates to coincide with the output coordinate in a simplied manner in an input-integrated display apparatus of a structure in which input coordinate designating means is combined integrally with a display screen. The method includes steps of displaying sequentially a plurality of predetermined reference coordinates on the display screen and inputting through input coordinate designating part the coordinates of points thereon designated by the operator which points correspond, respectively, to the reference coordinate points, arithmetically determining constants of predetermined coordinate transformation expressions representing correspondence between the input coordinates and the output coordinates on the basis of the plurality of the reference coordinates and the plurality of the corresponding input coordinates, and transforming the input coordinates supplied by the input coordinates designating part into output coordinates to be supplied to the display device in accordance with the coordinate transformation expressions containing the constants determined. In Yasushi Fukunage et al., a patent of a coordinate input method or an apparatus for a surface mount device capable of inputting a mounting coordinate of a surface mount device to be mounted on a printed circuit board at an arbitrary angle is not described.

SUMMARY OF THE INVENTION

Therefore, it is an object of the present invention, for the purpose of solving the above mentioned problems, to provide a coordinate input method and an apparatus for a surface mount device capable of inputting a mounting coordinate of a surface mount device to be mounted on a printed circuit board at an arbitrary angle.

In order to accomplish the above object, there is provided a mounting coordinate input method for a surface mount device, the method comprising the steps of:

a) taking an image of a printed circuit board;

b) inputting component information of the surface mount device to be mounted on the printed circuit board at an arbitrary angle to display a surface mount device mark printed on the printed circuit board corresponding to the component information;

c) setting coordinates of first and second reference corners of the surface mount device mark and calculating center coordinates of the surface mount device mark based on the first and second reference corner coordinates;

d) displaying a reference rectangle of the surface mount device mark based on the reference corners and the center coordinates of the surface mount device mark;

e) selecting an arbitrary angle set mode with the surface mount device to display a fan including a predetermined angle formed by a first side defining a straight line between the first reference corner of the surface mount device mark and a cursor on a screen and a second side defining a straight line between the first reference corner and an X-axis on the screen; and f) controlling the predetermined angle of the fan which allows the first side of the fan to coincide with a side of the surface mount device mark and setting the controlled angle of the fan as the arbitrary angle of the surface mount device.

Also, there is provided a mounting coordinate input apparatus for a surface mount device, the apparatus comprising:

a scanner for taking an image of a printed circuit board;

an input section for inputting component information of the surface mount device to be mounted on the printed circuit board, setting coordinates of first and second reference corners of a surface mount device mark printed on the printed circuit board, and selecting an arbitrary angle set mode with respect to the surface mount device;

a monitor for displaying the image of the printed circuit board from the scanner, a surface mount device mark printed on the printed circuit board corresponding to the component information input by the input section, a predetermined rectangle based on the two reference corners and the center coordinates set by input section as a reference of the surface mount device, a fan formed by a first side between a first corner of the surface mount device mark and a present cursor on a screen and a second side between the first corner and an X-axis on the screen including a predetermined angle formed by the selection of the arbitrary angle set mode; and a control section for calculating center coordinates of the surface mount device mark based on the first and second reference coordinates, and controlling the predetermined angle of the fan which allows the first side of the fan to coincide with a side of the surface mount device mark to set the controlled angle as the arbitrary angle of the surface mount device.

According to the present invention, a mounting coordinate of the surface mount device to be mounted on the PCB can be produced.

Other objects and further features of the present invention will become apparent from the detailed description when read in conjunction with the attached drawings.

BRIEF DESCRIPTION OF THE DRAWINGS

The above objects and advantages of the present invention will become more apparent by describing in detail a preferred embodiment thereof with reference to the attached drawings in which.

DESCRIPTION OF THE PREFERRED EMBODIMENTS

The preferred embodiment of the present invention will hereinafter be described in detail with reference to the accompanying drawings.

Figure 1:
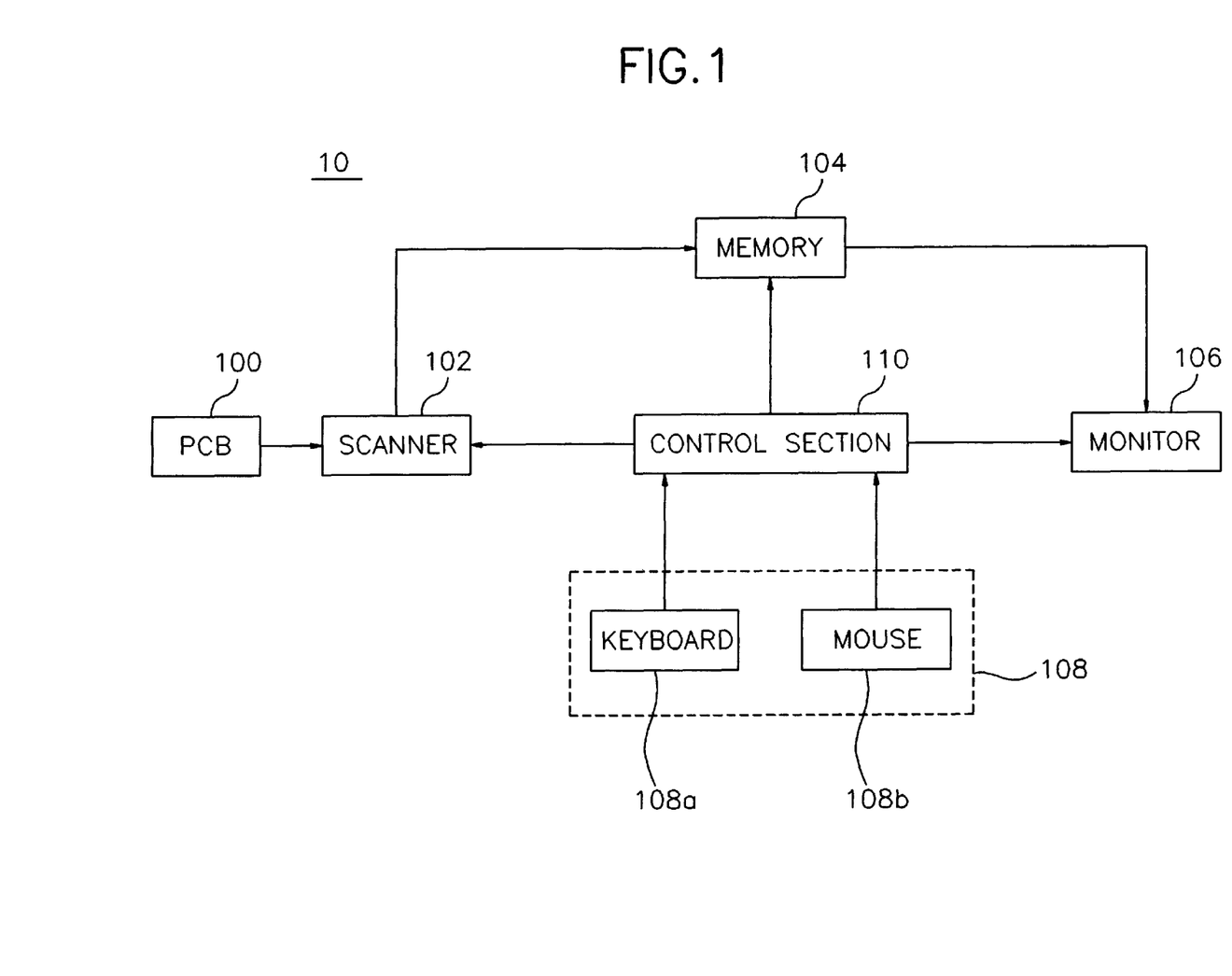
FIG. 1 is a block diagram for showing a coordinate input apparatus for a surface mount device according to an embodiment of the present invention.

FIG. 1 shows a coordinate input apparatus 10 for a surface mount device according to an embodiment of the present invention. The coordinate input apparatus 10 includes a scanner 102, memory 104, monitor 106, an input section 108, and a control section 110.

Figure 5:
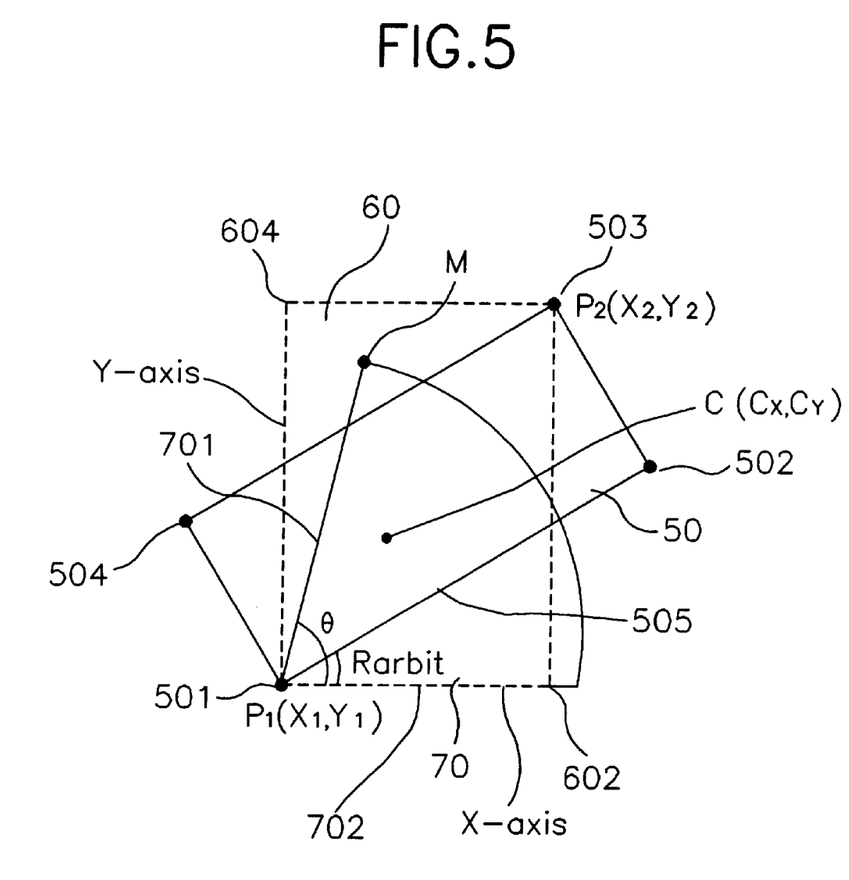
FIG. 5 is a view for showing a surface mount component which is displayed on the other screen of the monitor of FIG. 1.

The scanner 102 takes an image of a printed circuit board 100 and provides it to the memory 106. The input section 108 inputs component information of a surface mount device (not shown) to be mounted on the printed circuit board 100, sets coordinates $P_1(X_1,Y_1)$ and $P_2(X_2,Y_2)$ of first and second reference corners 501 and 503 of the surface mount device mark 50, and selects an arbitrary angle set mode with respect to the surface mount device. The input section 108 includes a keyboard 108a and a mouse 108b.

The monitor 106 displays the image of the printed circuit board from the scanner 102. The monitor 106 displays a coordinate input screen with respect to the surface mount device. The monitor 106 displays a component information edit window according to an operation of the input section 108. The monitor 106 displays a surface mount device mark 50 printed on the printed circuit board 100 corresponding to the component information input by the input section 108. The monitor 106 displays a reference rectangle 60 of the surface mount device mark based on the first and second reference corners 501 and 503 and the center point C set by input section 108. The monitor 106 displays a fan 70 including a predetermined angle θ formed by a first side defining a straight line between the first reference corner 501 of the surface mount device mark 50 and a present cursor M on a screen and a second side defining a straight line between the first reference corner of the surface mount device mark 50 and an X-axis on the screen by the selection of the arbitrary angle set mode of the input section 108.

The control section 110 controls an operation of the scanner 102, the memory 104, and the monitor 106. The control section 110 calculates a distorted angle $R_{PCB}$ of the PCB 100 with respect to the scanner 102 based on the image of the PCB displayed on the monitor 106. The control section 110 calculates coordinates $(C_X, C_Y)$ of center pointer of the surface mount device mark 50 based on the coordinates $P_1(X_1, Y_1)$ and $P_2(X_2, Y_2)$ of first and second reference corners 501 and 503. The control section 110 controls the predetermined angle θ of the fan 70 which allows the first side of the fan to coincide with a side of the surface mount device mark by a control of the cursor M, and sets the controlled angle as the arbitrary angle $R_{arbit}$ of the surface mount device in response to the command signal from the input section 108. The control section 110 calculates a mounting angle $R_{SMD}$ of the surface mount device based on the distorted angle $R_{PCB}$ of the PCB 100 and the arbitrary angle $R_{arbit}$ of the surface mount device.

The memory 104 stores an image of a printed circuit board 100 taken by the scanner 102, the coordinates $(C_X, C_Y)$ of center pointer of the surface mount device mark 50, the arbitrary angle $R_{arbit}$ of the surface mount device set by the control section 110, and the mounting angle $R_{SMD}$ of the surface mount device calculated by the control section 110.

Figure 2:
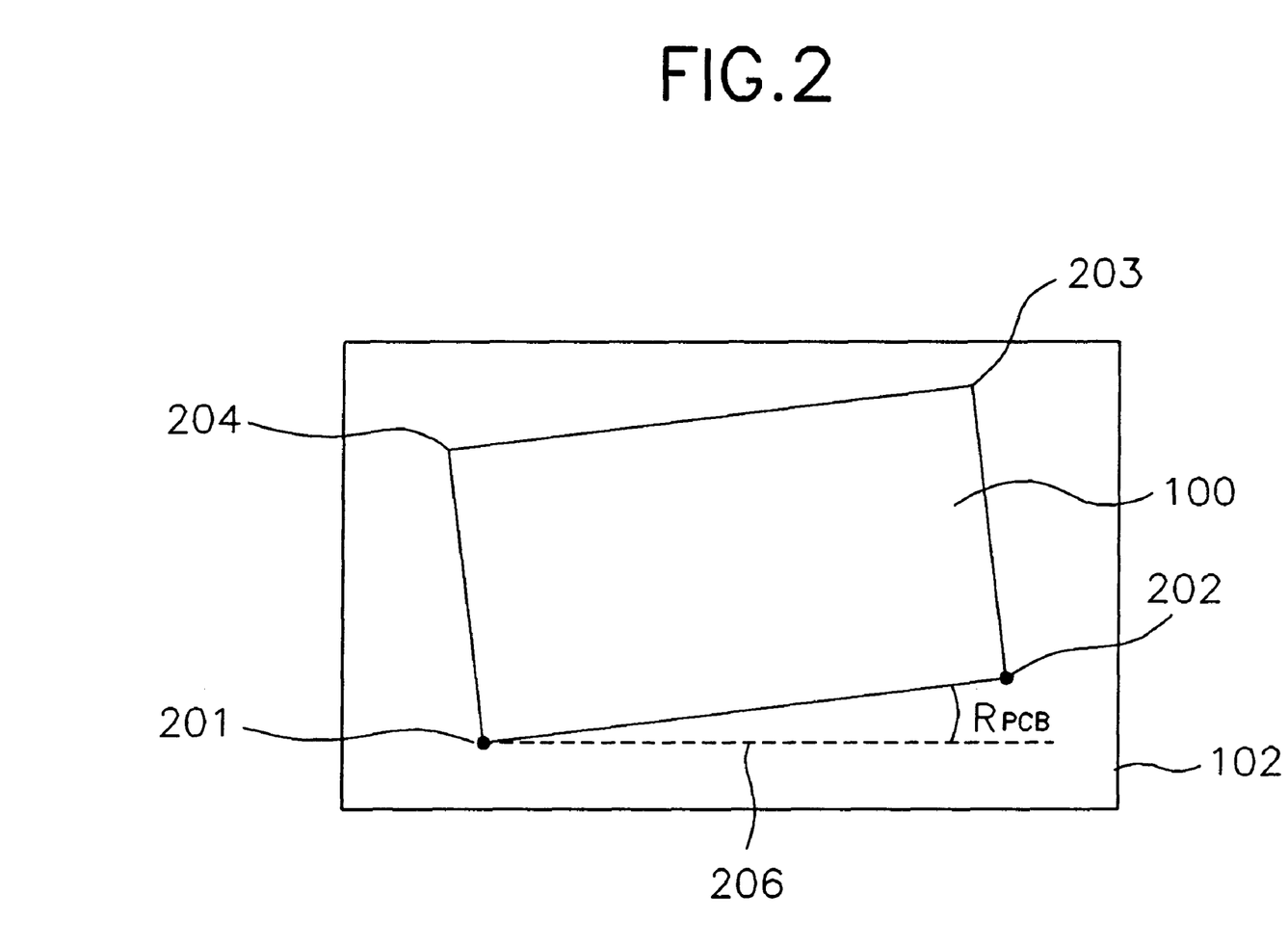
FIG. 2 is a view for showing a distorted angle of the PCB which is displayed on the monitor of FIG. 1.

FIG. 2 shows a distorted angle of the PCB which is displayed on the monitor 106 of FIG. 1. A reference numeral 100 is a PCB formed by four corners 201, 202, 203, and 204. A distorted angle $R_{PCB}$ is an angle between a side 205 formed by the corners 201 and 202 and an image reference line according to the scanner 102.

Figure 3:
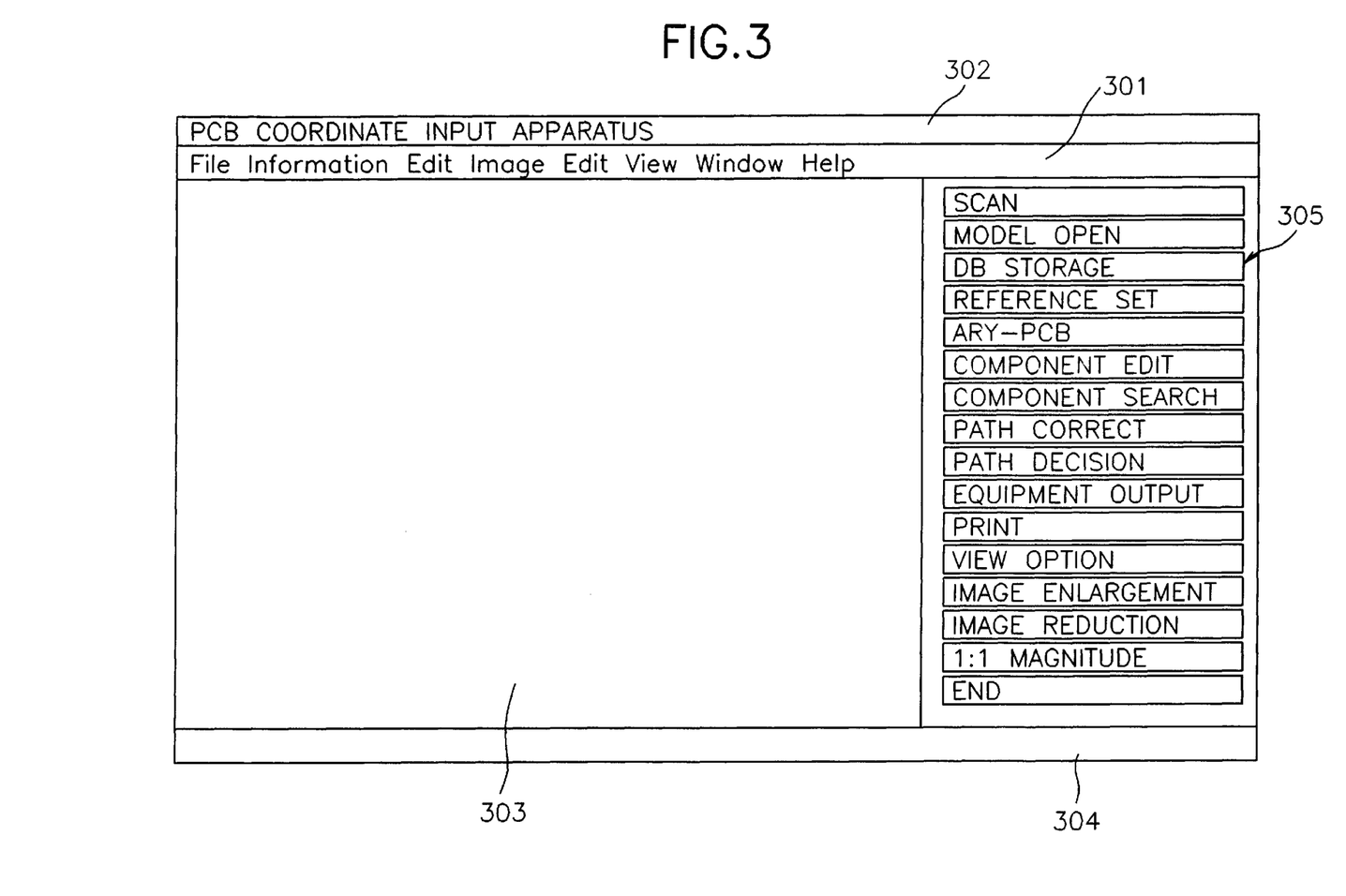
FIG. 3 is a view for showing an example of a coordinate input screen which is displayed on the monitor of FIG. 1.

FIG. 3 shows an example of a coordinate input screen which is displayed on the monitor of FIG. 1. The coordinate input screen includes a title bar 301, a menu for indicating executable function names disposed under the title bar 301, a coordinate display area 303 for displaying the PCB 100, a state indication area 304 for indicating a coordinate of a present cursor and a function of a present menu located at bottom of a screen, and a hot key for indicating a main function of a program. The menu includes a file, an information edit, an image edit, a view, a window, and a help indication. The hot key includes a scan key, a model open key, a database (DB) storage key, a reference set key, an array PCB key, a component edit key, a component search key, a path correct key, a path decision, an equipment output key, a printer key, a view option key, an image enlargement key, an image reduction key, 1:1 magnitude key, and an end key.

Figure 4:
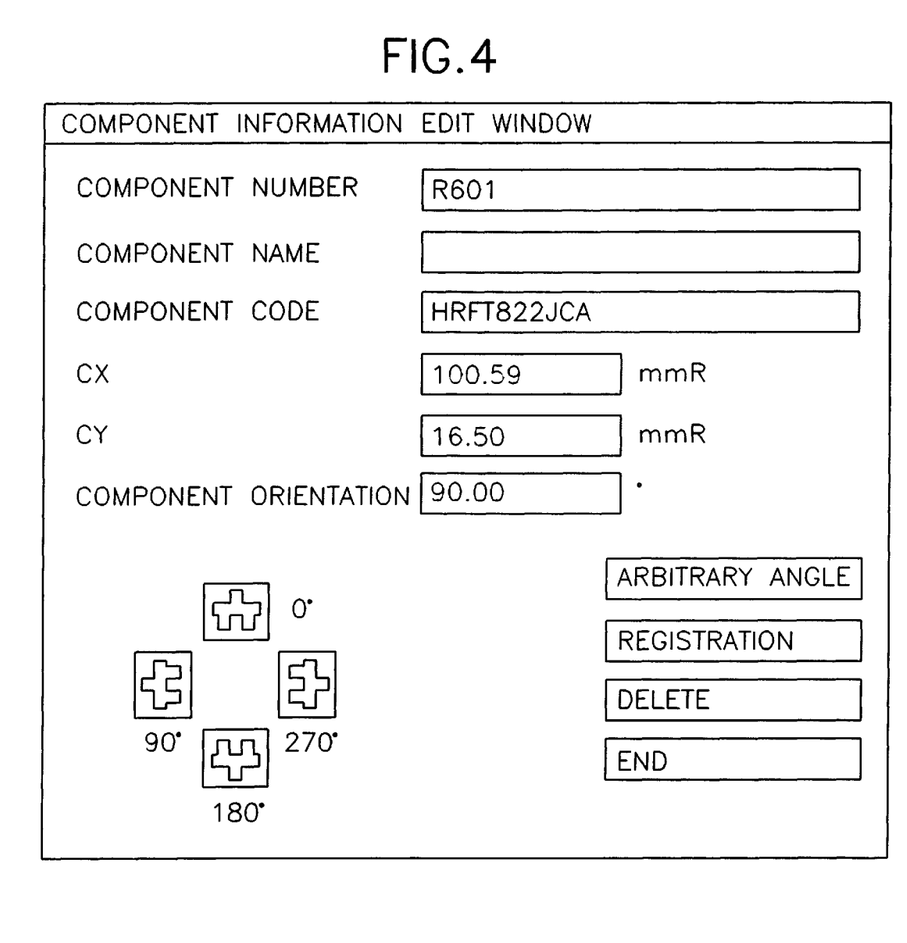
FIG. 4 is a view for showing an example of a component information edit window which is displayed on one screen of the monitor of FIG. 1.

FIG. 4 illustrates an example of a component information edit window which is displayed on a screen of the monitor of FIG. 1. The component information edit window which is displayed on one screen of the monitor 106 serves to edit information of a component. The component information edit window includes a component number label and edit for inputting a component number, a component code label and edit for indicating a component code, a component name label and edit for indicating a component name, a component specification label and edit for indicating a component specification, a central coordinate label and edit for indicating central coordinates (Cx, Cy) of a component, and a component orientation label and edit for indicating a mounting angle of a component. The component information edit window further includes an arbitrary angle set button for selecting an arbitrary angle set function, a registration button for selecting whether or not the set arbitrary angle is registered, a delete button for selecting whether or not the set arbitrary angle is deleted, and an end button for finishing the optional angle set function.

FIG. 5 shows a surface mount component 50 which is displayed on the other screen of the monitor 106 of FIG. 1. A reference numeral 50 represents a surface mount device mark printed on the PCB 100 formed by four corners 501, 502, 503, and 504. The corners 501 and 503 serve as first and second reference corners, respectively. Coordinates (Cx, Cy) of a center point C of the surface mount device 50 are calculated based on the coordinates $P_1(X_1, Y_1)$ and $P_2(X_2, Y_2)$ of the reference corners thereof. That is, the center coordinates (Cx, Cy) of the surface mount device 50 are calculated by equations $C_X = (X_1+X_2)/2$ and $C_Y=(Y_1+Y_2)/2$. A reference numeral 60 denotes a predetermined rectangle formed by four corners 501, 602, 503, and 604 and serves as a reference rectangle of the surface mount device mark 50. The reference rectangle 60 is displayed on the monitor 106 based on the two reference corners 501 and 503 and the center point C of the surface mount device mark 50.

By a click of the mouse 108b, when the arbitrary angle set button is selected, a fan 70 including a predetermined angle θ formed by a first side defining a straight line between the first reference corner 501 of the surface mount device mark 50 and a present cursor M on a screen and a second side defining a straight line between the first reference corner of the surface mount device mark 50 and an X-axis on the screen is displayed on the monitor 106. The magnitude and angle of the fan 70 change according to a movement of the mouse cursor M. When the user controls the predetermined angle θ of the fan 70 which allows the first side of the fan to coincide with a side of the surface mount device mark by controlling the cursor M, the predetermined angle θ of the fan 70 is controlled to the arbitrary angle $R_{arbit}$ of the surface mount device mark 50.

Figure 6:
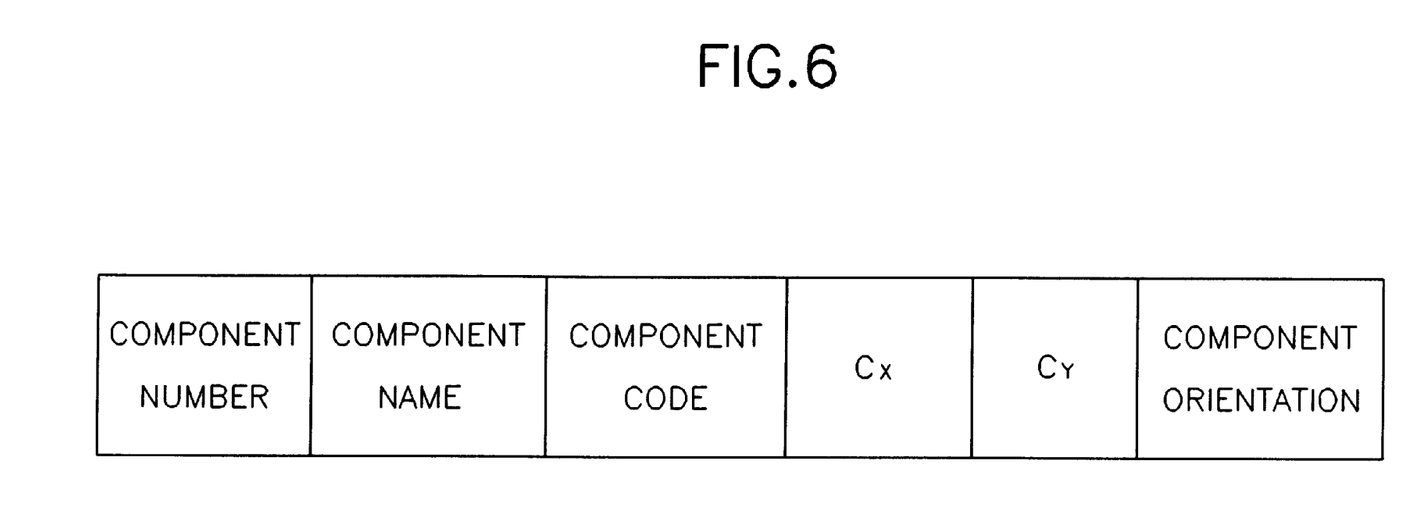
FIG. 6 is a view for showing a configuration of a component data base of the surface mount device to be stored in the memory of FIG. 1.

FIG. 6 shows a configuration of a component data base of the surface mount device to be stored in the memory of FIG. 1. The component data base of the surface mount device includes a component number, a component code, a component specification, central coordinates (Cx, Cy) of a component, and a component orientation.

Figure 7:
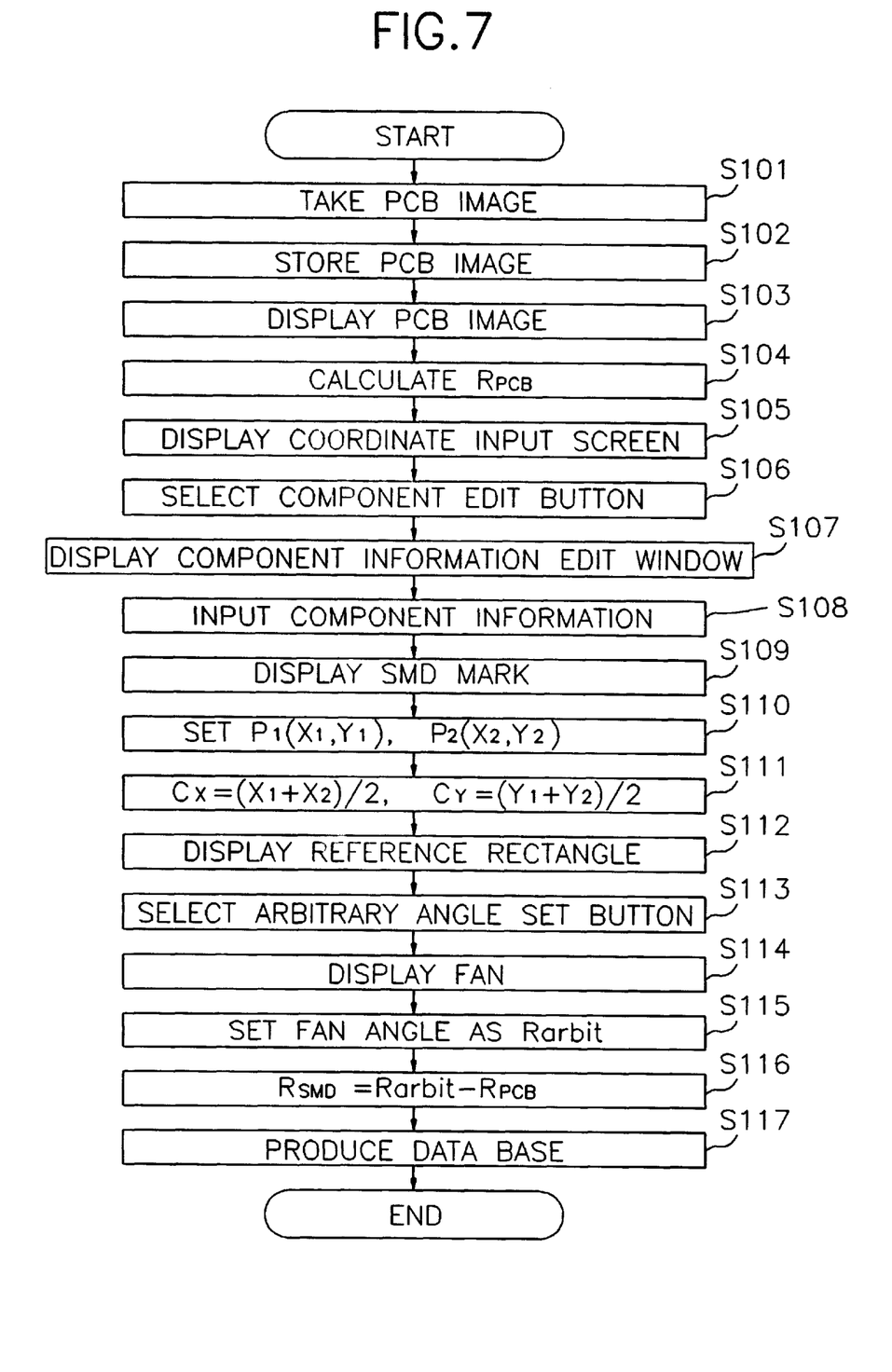
FIG. 7 is a flow chart for illustrating a mounting coordinate input method for a surface mount device according to an embodiment of the present invention.

Hereinafter, an operation of the mounting coordinate input apparatus and method for a surface mount device according to an embodiment of the present invention with reference to FIG. 7 will be described.

The control section 110 controls a scanner 102 to take an image of a PCB 100, and the scanner 102 provides the image of the PCB 100 to the memory 104 (step S101). In step S102, the control section 110 controls the memory 104 to store the image of the PCB from the scanner 102 therein. In step S103, the control section 110 controls the monitor 106 to display the image of the PCB stored in the memory 104, as shown in FIG. 2.

In step S104, the control section 110 calculates a distorted angle $R_{PCB}$ of the PCB 110 with respect to an image reference line 206 by the scanner 102 based on the image of the PCB displayed on the monitor 106 and stores the distorted angle $R_{PCB}$ of the PCB in the memory 104. In step S105, the control section 110 controls the monitor 106 to display a coordinate input screen with respect to a surface mount device (not shown) to be mounted on the PCB 100 at an arbitrary angle, as shown in FIG. 3.

When a user selects a component edit button on the coordinate input screen according to an operation of a keyboard 108a or a mouse 108b of the input section 108, a component edit command signal is applied to the control section 110 (step S106). Accordingly, the control section 110 controls a monitor 106 to display a component information window 20 for editing component information on one portion of the monitor 106 in response to the component edit command signal from the input section 108, as shown in FIG. 4 (step S107).

In step S108, when the user inputs a component information of the surface mount device including a component number, a component name, and a component code on the component information window displayed on the monitor with respect to a corresponding surface mount device to be mount at an arbitrary by a keyboard 108a of an input section 108, a component number command signal, a component name command signal, and a component code are inputted into a control section 110. Accordingly, the control section 110 controls the monitor 106 to display a surface mount device mark 500 printed on the PCB which corresponds to the component number, the component name, and the component code from the keyboard 108a on the other screen thereof(step S109).

In step S110, when the user controls the mouse 108b to move a cursor displayed on the monitor 106 on a first reference corner 501 and a second reference corner 503 of the surface mount device mark 500, respectively, and clicks the mouse 108b, first and second coordinates $P_1(X_1, Y_1)$ and $P_2(X_2, Y_2)$ of first reference corner 501 and a second reference corner 503 are set and inputted into the control section 110. In step S111, the control section 110 calculates center coordinates $C(C_X, C_Y)$ of the surface mount device 500 on the basis of the first and second reference coordinates $P_1(X_1, Y_1)$ and $P_2(X_2, Y_2)$. That is, the center coordinates $C(C_X, C_Y)$ of the surface mount device 500 are calculated by the equations $C_X=(X_1+X_2)/2$ and $C_Y=(Y_1+Y_2)/2$. In step S112, the control section 110 controls the monitor 106 to display a reference rectangle 60 defining four corners 501, 602, 503, and 604 shown in a dotted line on a screen thereof on the basis of the two reference corners 501 and 503 and the center coordinates $C_1(C_X, C_Y)$ as a reference rectangle of the surface mount device 500.

In step S113, when the user controls the mouse 108b to place the cursor at the arbitrary angle set button and selects the arbitrary angle set button according to a click of the mouse 108b, an arbitrary angle set command signal is applied to the control section 110. Accordingly, the control section 110 controls the monitor 106 to display a fan 70 formed by a first side 701 defining a straight line between the first reference corner 501 of the surface mount device mark 50 and a present cursor M of a screen and a second side 702 defining a straight line between the first reference corner 501 of the surface mount device mark 50 and an X-axis of the screen(step S114).

In step S115, when the user controls the mouse 108b to move the cursor M which allows the first side 701 of the fan 70 to coincide with a base 505 of the surface mount device 50 and clicks the mouse 108b, the predetermined angle of the fan is controlled into a control angle and set as the arbitrary angle $R_{arbit}$ of the surface mount device 50. And the arbitrary angle $R_{arbit}$ of the surface mount device 50 is indicated at a component orientation edit of the component information edit window and is stored in the memory 104.

In step S116, the control section 110 calculates a real mounting angle $R_{SMD}$ of the surface mount device 50 based on the distorted angle $R_{PCB}$ of the PCB and the arbitrary angle $R_{arbit}$ of the surface mount device mark stored in the memory 104. That is, the real mounting angle $R_{SMD}$ is calculated by the equation $R_{SMD}=R_{SMD}-R_{PCB}$.

In step S117, when the user controls the mouse 108b to move the mouse cursor at a registration button and clicks the mouse 108b, the control section 110 produces a database with respect to the surface mount device including a component name, a component name, a component code, center coordinates ($C_X$, $C_Y$), and a component direction, that is, a mounting angle, as shown FIG. 6 and stores the database in the memory 104.

In accordance with the present invention as mentioned, a mounting coordinate of the surface mount device to be mounted on the PCB can be produced.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A mounting coordinate input method for a surface mount device, said method comprising the steps of:
   a) taking an image of a printed circuit board;
   b) inputting component information of the surface mount device to be mounted on the printed circuit board at an arbitrary angle to display a surface mount device mark printed on the printed circuit board corresponding to the component information;
   c) setting coordinates of first and second reference corners of the surface mount device mark and calculating center coordinates of the surface mount device mark based on the first and second reference corner coordinates;
   d) displaying a reference rectangle of the surface mount device mark based on the reference corners and the center coordinates of the surface mount device mark;
   e) selecting an arbitrary angle set mode with the surface mount device to display a fan including a predetermined angle formed by a first side defining a straight line between the first reference corner of the surface mount device mark and a cursor on a screen and a second side defining a straight line between the first reference corner and an X-axis on the screen; and
   f) controlling the predetermined angle of the fan which allows the first side of the fan to coincide with a side of the surface mount device mark and setting the controlled angle of the fan as the arbitrary angle of the surface mount device.

2. The method as defined in claim 1, step a) includes
   a-1) receiving the image of the printed circuit board;
   a-2) storing the image of the printed circuit board; and
   a-3) displaying the stored image of the printed circuit board.

3. The method as defined in claim 1, wherein the component information includes a component number, a component name, and a component code of the surface mount device.

4. The method as defined in claim 1, wherein the arbitrary angle is an angle other than zero degree, ninety degrees, 180 degrees, and 270 degrees.

5. The method as defined in claim 1, wherein step b) includes the substeps of:
   b-1) displaying a coordinate input screen with respect to the surface mount device;
   b-2) selecting a component information edit mode from coordinate input screen to display a component information edit window; and
   b-3) inputting the component information of the surface device to display the surface mount device mark.

6. The method as defined in claim 1, wherein the center coordinates of the surface mount device are calculated by equations $C_X=(X_1+X_2)/2$ and $C_Y=(Y_1+Y_2)/2$, where ($C_X$, $C_Y$) are the center coordinates of the surface mount device and ($X_1$, $Y_1$) and ($X_2$, $Y_2$) are coordinates of first and second reference corners, respectively.

7. The method as defined in claim 1, wherein the predetermined angle of the fan is controlled by controlling the cursor on the screen.

8. A mounting coordinate input method for a surface mount device, said method comprising the steps of:
   i) taking an image of a printed circuit board;
   ii) calculating a distorted angle of the printed circuit board based on the image of the printed circuit board;
   iii) inputting component information of the surface mount device to be mounted on the printed circuit board at an arbitrary angle to display a surface mount device mark printed on the printed circuit board corresponding to the component information from the imaged printed circuit board;
   iv) setting coordinates of first and second reference corners of the surface mount device mark and calculating center coordinates of the surface mount device mark based on the first and second reference corner coordinates;
   v) displaying a predetermined rectangle based on the reference corners and the center coordinates as a reference of the surface mount device mark;
   vi) selecting an arbitrary angle set mode with the surface mount device to display a fan including a predetermined angle formed by a first side defining a straight line between the first reference corner of the surface mount device mark and a present cursor on a screen and a second side defining a straight line between the first reference corner and an X-axis on the screen; and
   vii) controlling the predetermined angle of the fan which allows the first side of the fan to coincide with a side of the surface mount device mark and setting the controlled angle of the fan as the arbitrary angle of the surface mount device; and
   viii) calculating a mounting angle of the surface mount device based on the distorted angle of the printed circuit board and the set arbitrary angle of the surface mount device.

9. The method as defined in claim 8, step i) includes i-1) receiving the image of the printed circuit board;

i-2) storing the image of the printed circuit board; and i-3) displaying the stored image of the printed circuit board.

10. The method as defined in claim 8, wherein step iii) includes the substeps of:

iii-1) displaying a coordinate input screen with respect to the surface mount device;

iii-2) selecting a component information edit mode from coordinate input screen to display a component information edit window; and iii-3) inputting the component information of the surface device to display the surface mount device mark.

11. The method as defined in claim 8, wherein the mounting angle of the surface mount device is calculated by an equation $R_{SMD}=R_{arbit}-R_{PCB}$, where $R_{SMD}$ is the mounting angle of the surface mount device, $R_{arbit}$ is the set arbitrary angle, and $R_{PCB}$ is the distorted angle of the imaged printed circuit.

12. The method as defined in claim 8, further producing a database of the component information, the center coordinates, the mounting angle in order to register the mounting angle of the surface mount device.

13. A mounting coordinate input apparatus for a surface mount device, said apparatus comprising:

a scanner for taking an image of a printed circuit board;

an input section for inputting component information of the surface mount device to be mounted on the printed circuit board, setting coordinates of first and second reference corners of a surface mount device mark printed on the printed circuit board, and selecting an arbitrary angle set mode with respect to the surface mount device;

a monitor for displaying the image of the printed circuit board from the scanner, a surface mount device mark printed on the printed circuit board corresponding to the component information input by the input section, a predetermined rectangle based on the two reference corners and the center coordinates set by input section as a reference of the surface mount device, a fan formed by a first side between a first corner of the surface mount device mark and a present cursor on a screen and a second side between the first corner and an X-axis on the screen including a predetermined angle formed by the selection of the arbitrary angle set mode; and a control section for calculating center coordinates of the surface mount device mark based on the first and second reference coordinates, and controlling the predetermined angle of the fan which allows the first side of the fan to coincide with a side of the surface mount device mark to set the controlled angle as the arbitrary angle of the surface mount device.

14. The apparatus as defined in claim 13, wherein the component information includes a component number, a component name, and a component code of the surface mount device.

15. The apparatus as defined in claim 13, wherein the center coordinates of the surface mount device are calculated by equations $C_X=(X_1+X_2)/2$ and $C_Y=(Y_1+Y_2)/2$, where $(C_X, C_Y)$ are the center coordinates of the surface mount device and $(X_1, Y_1)$ and $(X_2, Y_2)$ are coordinates of two reference corners.

16. The apparatus as defined in claim 13 further comprising a memory for storing the image of a printed circuit board taken by the scanner, the center coordinates of the surface mount device mark, and the arbitrary angle of the surface mount device.

17. A mounting coordinate input apparatus for a surface mount device, said apparatus comprising:

a scanner for taking an image of a printed circuit board;

an input section for inputting a component information of the surface mount device to be mounted on the printed circuit board, setting coordinates of first and second reference corners of a surface mount device mark printed on the pinted circuit board, and selecting an arbitrary angle set mode with respect to the surface mount device;

a monitor for displaying the image of the printed circuit board from the scanner, a surface mount device mark printed on the printed circuit board corresponding the component information input by the input section, a predetermined rectangle based on the two reference corners and the center coordinates set by input section as a reference of the surface mount device, a fan formed by a first side between a first corner of the surface mount device mark and a present cursor on a screen and a second side between the first corner and an X-axis on the screen including a predetermined angle formed by the selection of the arbitrary angle set mode;

a control section for calculating center coordinates of the surface mount device mark based on the first and second reference coordinates, calculating a distorted angle of the printed circuit board based on the taken image thereof, controlling the predetermined angle of the fan which allows the first side of the fan to coincide with a side of the surface mount device mark to set the controlled angle as the arbitrary angle of the surface mount device, and calculating a mounting angle of the surface mount device based on the distorted angle of the printed circuit board and the set arbitrary angle of the surface mount device; and a memory for storing the image of a printed circuit board taken by the scanner, the center coordinates of the surface mount device mark, the arbitrary angle and the mounting angle of the surface mount device set by the control section.

18. The apparatus as defined in claim 17, wherein the center coordinates of the surface mount device are calculated by equations $C_X=(X_1+X_2)/2$ and $C_Y=(Y_1+Y_2)/2$, where $(C_X, C_Y)$ are the center coordinates of the surface mount device and $(X_1, Y_1)$ and $(X_2, Y_2)$ are coordinates of two reference corners.

19. The apparatus as defined in claim 17, wherein the mounting angle of the surface mount device is calculated by an equation $R_{SMD}=R_{arbit}-R_{PCB}$, where, $R_{SMD}$ is the mounting angle of the surface mount device, $R_{arbit}$ is the set arbitrary angle, and $R_{PCB}$ is the distorted angle of the imaged printed circuit.

20. The apparatus as defined in claim 17, the control section produces a database the component information, the center coordinates, the mounting angle in order to register the mounting angle of the surface mount device.

* * * * *